United States Patent
Zuo et al.

(10) Patent No.: US 11,444,604 B2
(45) Date of Patent: Sep. 13, 2022

(54) PHASE TRACKING PULSE GENERATION CIRCUIT AND POWER SUPPLY DEVICE

(71) Applicant: SHENZHEN TCL NEW TECHNOLOGY CO., LTD., Guangdong (CN)

(72) Inventors: Dexiang Zuo, Shenzhen (CN); Guoliang Tang, Shenzhen (CN)

(73) Assignee: Shenzhen TCL New Technology Co., Ltd., Shenzhen (CN)

( * ) Notice: Subject to any disclaimer, the term of this patent is extended or adjusted under 35 U.S.C. 154(b) by 0 days.

(21) Appl. No.: 17/266,681

(22) PCT Filed: Mar. 13, 2020

(86) PCT No.: PCT/CN2020/079314
§ 371 (c)(1),
(2) Date: Feb. 8, 2021

(87) PCT Pub. No.: WO2020/187163
PCT Pub. Date: Sep. 24, 2020

(65) Prior Publication Data
US 2021/0305970 A1 Sep. 30, 2021

(30) Foreign Application Priority Data
Mar. 20, 2019 (CN) .......................... 201920362051.7

(51) Int. Cl.
*H03K 3/012* (2006.01)
*H03K 5/24* (2006.01)

(52) U.S. Cl.
CPC ............... *H03K 3/012* (2013.01); *H03K 5/24* (2013.01)

(58) Field of Classification Search
CPC ........ H03K 3/012; H03K 5/24; H03K 17/567; H03K 3/0231; H03K 7/08; H02M 3/07;
(Continued)

(56) References Cited

U.S. PATENT DOCUMENTS

2010/0253309 A1* 10/2010 Xi .......................... H02M 3/156
323/288
2013/0063108 A1* 3/2013 Nishida ................ H02M 3/156
323/271
(Continued)

FOREIGN PATENT DOCUMENTS

CN 103116062 A 5/2013
CN 107942127 A 4/2018
(Continued)

OTHER PUBLICATIONS

International Search Report, dated Jun. 22, 2020, for Shenzhen TCL New Technology Co., Ltd., International Application No. PCT/CN2020/079314, filed Mar. 13, 2020.
(Continued)

*Primary Examiner* — John W Poos
(74) *Attorney, Agent, or Firm* — Menachem Nathan; Nathan & Associates

(57) ABSTRACT

Disclosed are a phase-tracked pulse generation circuit and a power supply device. The present application uses a driving pulse rising edge of a power supply as a reference, and uses a constant current circuit to charge a charging and discharging circuit at a constant current. When the reference driving pulse rising edge comes, the charging and discharging circuit is discharged; the peak voltage on the charging and discharging circuit is taken out and then divided for comparison with the voltage on the charging and discharging circuit; when the voltage on the charging and discharging circuit is equal to a divided voltage value of the peak voltage, the output of a comparison circuit turns high, and the output of a comparator is the phase-tracked pulse; the rising edge of the phase-tracked pulse can be used for synchronizing another power supply.

18 Claims, 1 Drawing Sheet

(58) Field of Classification Search
CPC .......... H02M 3/156; H02M 1/08; H02M 1/36;
H02M 1/32; H02M 3/158; H02M 7/217;
H02M 1/0006; H02M 3/33523; H02M
1/4225; H02M 1/14; H02M 3/33507;
H02M 7/06; H02M 1/0058; H02M
1/0032; H02M 1/0048; H02M 1/008;
H02M 1/009; H02M 1/088; H02M 1/042;
H02M 1/081
See application file for complete search history.

(56) References Cited

U.S. PATENT DOCUMENTS

| | | | | |
|---|---|---|---|---|
| 2014/0340949 | A1* | 11/2014 | Chen | H02M 1/4225 363/44 |
| 2015/0326161 | A1* | 11/2015 | Rodriguez | H02P 9/02 322/19 |
| 2019/0267981 | A1* | 8/2019 | Chan | H03K 5/06 |

FOREIGN PATENT DOCUMENTS

| | | |
|---|---|---|
| CN | 109302066 A | 2/2019 |
| CN | 209462353 U | 10/2019 |

OTHER PUBLICATIONS

Written Opinion of the international Search Authority, dated Jun. 22, 2020, for Shenzhen TCL New Technology Co., Ltd., International Application No. PCT/CN2020/079314, filed Mar. 13, 2020.

* cited by examiner

PHASE TRACKING PULSE GENERATION CIRCUIT AND POWER SUPPLY DEVICE

CROSS REFERENCE TO RELATED APPLICATIONS

This application is the National Stage of International Application No. PCT/CN2020/079314, filed on Mar. 13, 2020, which claims the priority of Chinese patent application filed in the National Intellectual Property Administration, PRC on Mar. 20, 2019, with the application number 201920362051.7 and title "Phase Tracking Pulse Generation Circuit And Power Supply Device", the entire contents of which are hereby incorporated by reference.

TECHNICAL FIELD

This application relates to the field of power supply technology, and in particular to a phase tracking pulse generation circuit and a power supply device.

BACKGROUND

With the development of power supply technology and the increasing demand for diversity of power consumption, more and more occasions require two power sources or even more than two power sources to supply power to a load at the same time to improve the reliability and power supply efficiency of the power supply system.

However, when there are two power supplies working at the same time in the power supply device, if the peak currents of the two power supplies are large, the instantaneous peak power will also be large, resulting in large interference between the two power supplies, which not only affects the stable operation of the power system, but also causes interference to other devices.

SUMMARY

The main object of this application is to provide a phase tracking pulse generation circuit and a power supply device, aiming to solve the technical problem of instability of the power supply system caused by large peak currents when two power supplies work simultaneously in the prior art.

In order to achieve the above object, this application provides a phase tracking pulse generation circuit, including a constant current circuit, a peak voltage circuit, a pulse rising edge extraction circuit, a switch circuit, a charge and discharge circuit, and a comparison circuit. The pulse rising edge extraction circuit is configured to receive a drive pulse output by a first power supply. The comparison circuit is configured to output a phase tracking pulse to a second power supply. The constant current circuit is connected to the peak voltage circuit and the charge and discharge circuit respectively. The pulse rising edge extraction circuit is connected to the switch circuit. The switch circuit is connected to the charge and discharge circuit and the comparison circuit respectively. The charge and discharge circuit is connected to the comparison circuit.

The constant current circuit is configured to generate a constant current, and charge the charge and discharge circuit.

The pulse rising edge extraction circuit is configured to extract the drive pulse of the first power supply, and control on and off of the switch circuit according to the drive pulse.

The switch circuit is configured to control the charge and discharge circuit to discharge when the switch circuit is turned on.

The charge and discharge circuit is configured to provide a first voltage to the comparison circuit during charge or discharge.

The peak voltage circuit is configured to extract a peak voltage of the charge and discharge circuit, adjust the peak voltage to obtain a second voltage, and output the second voltage to the comparison circuit.

The comparison circuit is configured to compare the first voltage with the second voltage and output the phase tracking pulse.

Optionally, the peak voltage circuit includes a peak sampling unit and a voltage regulation unit. The peak sampling unit is connected to the constant current circuit, the charge and discharge circuit, and the voltage regulation unit respectively. The voltage regulation unit is connected to the comparison circuit.

Optionally, the peak sampling unit includes a first comparator, a first resistor, a first diode and a first capacitor.

A first voltage input terminal of the first comparator is connected to the constant current circuit and the charge and discharge circuit respectively. A second voltage input terminal of the first comparator is connected to a first terminal of the first capacitor and the voltage regulation unit respectively. An output terminal of the first comparator is connected to a first terminal of the first resistor and an anode of the first diode respectively. A power input terminal of the first comparator is connected to a power supply. A ground terminal of the first comparator is grounded.

A second terminal of the first resistor is connected to the power supply.

A cathode of the first diode is connected to the second voltage input terminal of the first comparator, the first terminal of the first capacitor and the voltage regulation unit respectively.

A second terminal of the first capacitor is grounded.

Optionally, the voltage regulation unit includes a second resistor and a third resistor. A first terminal of the second resistor is connected to the cathode of the first diode and the first terminal of the first capacitor respectively. A second terminal of the second resistor is connected to the comparison circuit, and the second terminal of the second resistor is further grounded through the third resistor.

Optionally, the constant current circuit includes a first triode, a fourth resistor, a fifth resistor, and a second diode.

A base of the first triode is grounded through the fourth resistor, and the base of the first triode is further connected to an anode of the second diode. An emitter of the first triode is connected to a first terminal of the fifth resistor. A collector of the first triode is connected to the first voltage input terminal of the first comparator and the charge and discharge circuit respectively.

A cathode of the second diode is connected to the power supply.

A second terminal of the fifth resistor is connected to the power supply.

Optionally, the charge and discharge circuit includes a second capacitor. A first terminal of the second capacitor is connected to the comparison circuit, the collector of the first triode, the switch circuit and the first voltage input terminal of the first comparator respectively. A second terminal of the second capacitor is grounded.

Optionally, the pulse rising edge extraction circuit includes a third capacitor, a third diode, and a sixth resistor. A first terminal of the third capacitor is configured to receive the drive pulse output by the first power supply. A second terminal of the third capacitor is grounded through the third diode. The second terminal of the third capacitor is further grounded through the sixth resistor. The second terminal of the third capacitor is further connected to the switch circuit.

Optionally, the switch circuit includes a second triode. A gate of the second triode is connected to the second terminal of the third capacitor. A drain of the second triode is connected to the comparison circuit and the first terminal of the second capacitor respectively. A source of the second triode is grounded.

Optionally, the comparison circuit includes a second comparator and a seventh resistor.

A first voltage input terminal of the second comparator is connected to the first terminal of the second capacitor. A second voltage input terminal of the second comparator is connected to a first terminal of the third resistor. A power input terminal of the second comparator is connected to the power supply. A ground terminal of the second comparator is grounded. An output terminal of the second comparator is connected to a first terminal of the seventh resistor and the second power supply respectively.

A second terminal of the seventh resistor is connected to the power supply.

This application further provides a power supply device, which includes the phase tracking pulse generation circuit as described above.

In this application, a rising edge of a drive pulse of a power supply is taken as a reference, and a constant current circuit charges a charge and discharge circuit with constant current. When the rising edge of the reference drive pulse comes, the charge and discharge circuit is discharged. A peak voltage on the charge and discharge circuit is taken out and divided to be compared with a voltage on the charge and discharge circuit. When the voltage on the charge and discharge circuit is equal to the divided value of the peak voltage, the output of the comparison circuit turns high. The output of the comparator is the phase tracking pulse, and its rising edge may be configured to synchronize another power supply, thereby reducing the peak power of the power supplies, reducing the interference generated by the power supplies, and also improving the reliability of the power supplies themselves. This application is suitable for staggered-phase working of two power supplies.

BRIEF DESCRIPTION OF THE DRAWINGS

In order to more clearly describe the technical solutions in the embodiments of this application or the prior art, the following will briefly introduce the drawings that need to be used in the description of the embodiments or the prior art. Obviously, the drawings in the following description are only some embodiments of this application. For those of ordinary skill in the art, without creative work, other drawings can be obtained according to the structures shown in these drawings.

Figure 1:
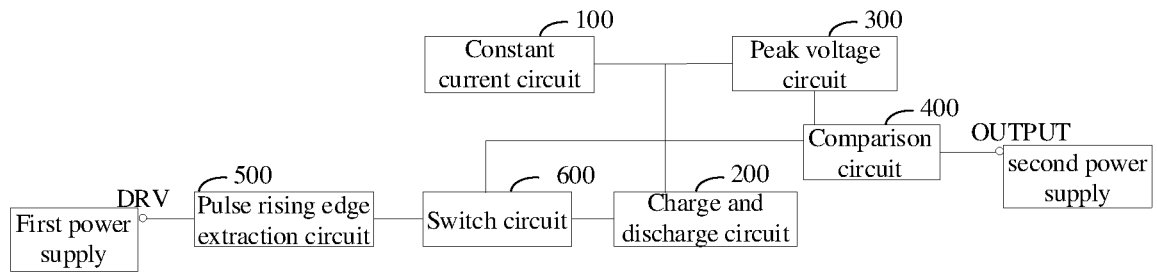
FIG. 1 is a functional block diagram of a phase tracking pulse generation circuit according to an embodiment of this application.

The realization, functional characteristics, and advantages of the purpose of this application will be further described in conjunction with the embodiments and with reference to the accompanying drawings.

DETAILED DESCRIPTION OF THE EMBODIMENTS

The technical solutions in the embodiments of this application will be described clearly and completely in conjunction with the drawings in the embodiments of this application. Obviously, the described embodiments are only a part of the embodiments of this application, but not all the embodiments. Based on the embodiments in this application, all other embodiments obtained by those of ordinary skill in the art without creative work shall fall within the protection scope of this application.

It should be noted that if there is a directional indication (such as up, down, left, right, front, back . . . ) in the embodiment of this application, the directional indication is only used to explain the relative positional relationship, movement conditions, etc. among the components in a specific posture (as shown in the drawings), if the specific posture changes, the directional indicator also changes accordingly.

In addition, if there are descriptions related to "first", "second", etc. in the embodiments of this application, the descriptions of "first", "second", etc. are for descriptive purposes only, and cannot be understood as indicating or implying their relative importance or implicitly indicating the number of indicated technical features. Thus, the features defined as "first" and "second" may include at least one of the features either explicitly or implicitly. In addition, the technical solutions between the various embodiments can be combined with each other, but they must be based on the ability of those skilled in the art to realize. When the combination of technical solutions conflicts with each other or cannot be realized, it should be considered that the combination of such technical solutions does not exist, nor within the scope of protection required by this application.

This application provides a phase tracking pulse generation circuit.

Referring to FIG. 1, in an embodiment, the circuit includes a constant current circuit 100, a peak voltage circuit 300, a pulse rising edge extraction circuit 500, a switch circuit 600, a charge and discharge circuit 200, and a comparison circuit 400. The pulse rising edge extraction circuit 500 is configured to receive a drive pulse DRV output by a first power supply. The comparison circuit 400 is configured to output a phase tracking pulse OUTPUT to a second power supply. The constant current circuit 100 is connected to the peak voltage circuit 300 and the charge and discharge circuit 200 respectively. The pulse rising edge extraction circuit 500 is connected to the switch circuit 600. The switch circuit 600 is connected to the charge and discharge circuit 200 and the comparison circuit 400 respectively. The charge and discharge circuit 200 is connected to the comparison circuit 400. The constant current circuit 100 is configured to generate a constant current, and charge the charge and discharge circuit 200. The pulse rising edge extraction circuit 500 is configured to extract the drive pulse DRV of the first power supply, and control on and off of the switch circuit 600 according to the drive pulse DRY. The switch circuit 600 is configured to control the charge and discharge circuit 200 to discharge when the switch circuit is turned on. The charge and discharge circuit 200 is configured to provide a first voltage to the comparison circuit 400 during charge or discharge. The peak voltage circuit 300 is configured to extract a peak voltage of the charge and discharge circuit 200, adjust the peak voltage to obtain a second voltage, and output the second voltage to the comparison circuit 400. The comparison circuit 400 is configured to compare the first voltage with the second voltage and output the phase tracking pulse.

It should be noted that when the two power supplies work at the same time, if the two power supplies work in staggered phases, the peak current during operation is small, and the interference caused is small, which is beneficial to the stable operation of the power supply system. At the same time, because the two power supplies work in staggered phases, the instantaneous peak power is small and the interference to other devices is small. Therefore, in this embodiment, a synchronization signal is needed to coordinate the operation of the two power supplies. In this embodiment, a rising edge of a drive pulse of a power supply is taken as a reference, and a constant current circuit charges a capacitor in a charge and discharge circuit with constant current. When the rising edge of the reference drive pulse comes, the capacitor is discharged. A peak voltage on the capacitor is taken out and divided to be compared with a voltage on the charge and discharge circuit. When the voltage on the capacitor is equal to the divided value of the peak voltage, the output of the comparison circuit turns high. The output of the comparator is the phase tracking pulse.

In this embodiment, by generating a pulse signal with a fixed phase relationship with the power supply drive pulse, the rising edge of the pulse signal may be configured to synchronize another power supply, thereby reducing the peak power of the power supplies, reducing interference generated by the power supplies, and improving the reliability of the power supplies themselves. This application is suitable for staggered-phase working of two power supplies.

Figure 2:
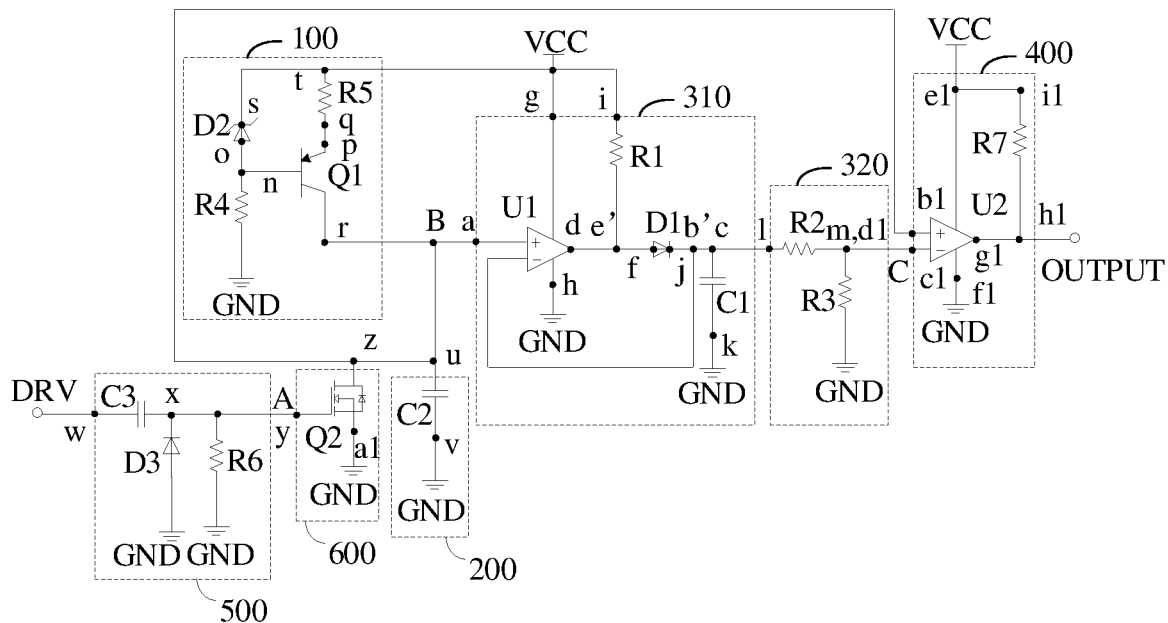
FIG. 2 is a schematic structural diagram of the phase tracking pulse generation circuit according to an embodiment of this application.

Referring to FIG. 2, in an embodiment, the peak voltage circuit 300 includes a peak sampling unit 310 and a voltage regulation unit 320. The peak sampling unit 310 is connected to the constant current circuit 100, the charge and discharge circuit 200, and the voltage regulation unit 320 respectively. The voltage regulation unit 320 is connected to the comparison circuit 400.

It should be noted that after being taken out from the charge and discharge circuit 200 by the peak sampling unit 310, the peak voltage is divided by the voltage regulation unit 320. After the voltage division, the voltage at point C is related to the resistance of the voltage regulation unit 320, and the voltage magnitude of the point C determines the phase relationship between the output pulse signal and the input drive pulse.

In order to extract the peak voltage of the charge and discharge circuit 200, the peak sampling unit 310 includes a first comparator U1, a first resistor R1, a first diode D1 and a first capacitor C1. A first voltage input terminal a of the first comparator U1 is connected to the constant current circuit 100 and the charge and discharge circuit 200 respectively. A second voltage input terminal b of the first comparator U1 is connected to a first terminal c of the first capacitor C1 and the voltage regulation unit 320 respectively. An output terminal d of the first comparator U1 is connected to a first terminal e of the first resistor R1 and an anode f of the first diode D1 respectively. A power input terminal g of the first comparator U1 is connected to a power supply VCC. A ground terminal h of the first comparator U1 is grounded. A second terminal i of the first resistor R1 is connected to the power supply VCC. A cathode j of the first diode D1 is connected to the second voltage input terminal b of the first comparator U1, the first terminal c of the first capacitor C1 and the voltage regulation unit 320 respectively. A second terminal k of the first capacitor C1 is grounded.

It should be understood that the first comparator U1 may be a general low-cost comparator, such as LM393, of course, it may also be of other types, which is not limited in this embodiment.

Further, in order to determine the phase relationship between the output pulse signal and the input drive pulse, the voltage regulation unit 320 includes a second resistor R2 and a third resistor R3. A first terminal l of the second resistor R2 is connected to the cathode j of the first diode D1 and the first terminal c of the first capacitor C1 respectively. A second terminal m of the second resistor R2 is connected to the comparison circuit 400, and the second terminal m of the second resistor R2 is further grounded through the third resistor R3.

It should be noted that the second resistor R2 and the third resistor R3 are both voltage divider resistors, which are configured to divide the peak voltage extracted from the peak sampling unit 310. When the resistance values of the second resistor R2 and the third resistor R3 are equal, the output pulse phase forms a 90-degree phase of the pulse delayed drive pulse.

In addition, the first resistor R1 is a pull-up resistor. In order to improve the peak sampling accuracy and response speed, and to reduce the sampling error, the resistance of the first resistor R1 should be less than 100 times the sum of the resistance of the second resistor R2 and the third resistor R3.

The constant current circuit 100 includes a first triode Q1, a fourth resistor R4, a fifth resistor R5, and a second diode D2. A base n of the first triode Q1 is grounded through the fourth resistor R4, and the base n of the first triode Q1 is further connected to an anode o of the second diode D2. An emitter p of the first triode Q1 is connected to a first terminal q of the fifth resistor R5. A collector r of the first triode Q1 is connected to the first voltage input terminal a of the first comparator U1 and the charge and discharge circuit 200 respectively. A cathode s of the second diode D2 is connected to the power supply VCC. A second terminal t of the fifth resistor R5 is connected to the power supply VCC.

It is understandable that the power supply VCC provides a VCC voltage to power the entire phase tracking pulse generation circuit.

The second diode D2 is a Zener diode for generating a stable voltage value.

The constant current circuit 100 is configured to generate a constant current, and the constant current value is: (VD2−VQ1$eb$)/R5, where VD2 is voltage stabilization value of Zener diode D2, and VQ1$eb$ is voltage value between e-b poles of the first transistor Q1; the constant current generated by the constant current circuit 100 is configured to linearly charge the charge and discharge circuit 200.

Optionally, the charge and discharge circuit 200 includes a second capacitor C2. A first terminal u of the second capacitor C2 is connected to the comparison circuit 400, the collector r of the first triode Q1, the switch circuit 600 and the first voltage input terminal a of the first comparator U1 respectively. A second terminal v of the second capacitor C2 is grounded.

It should be understood that the comparison circuit 400 obtains different voltage values by charging and discharging the second capacitor C2, so as to output a phase tracking pulse after comparison.

The pulse rising edge extraction circuit 500 includes a third capacitor C3, a third diode D3, and a sixth resistor R6.

A first terminal w of the third capacitor C3 is configured to receive the drive pulse DRV output by the first power supply. A second terminal x of the third capacitor C3 is grounded through the third diode D3. The second terminal x of the third capacitor C3 is further grounded through the sixth resistor R6. The second terminal x of the third capacitor C3 is further connected to the switch circuit 600.

Further, the switch circuit 600 includes a second triode Q2. A gate y of the second triode Q2 is connected to the second terminal x of the third capacitor C3. A drain z of the second triode Q2 is connected to the comparison circuit 400 and the first terminal u of the second capacitor C2 respectively. A source a1 of the second triode Q2 is grounded.

It should be noted that the second triode Q2 is a Metal-Oxide-Semiconductor Field-Effect Transistor (MOSFET), which functions as a controlled switch.

In implementation, the pulse rising edge extraction circuit 500 is configured to extract the main power supply or the first power drive pulse DRV rising edge narrow pulse, and control the second triode Q2 to turn on or off. When the pulse rising edge extraction circuit 500 extracts the drive pulse rising edge narrow pulse, the second triode Q2 is turned on, otherwise, the second triode Q2 is turned off.

The comparison circuit includes a second comparator U2 and a seventh resistor R7. A first voltage input terminal b1 of the second comparator U2 is connected to the first terminal u of the second capacitor C2. A second voltage input terminal c1 of the second comparator U2 is connected to a first terminal d1 of the third resistor R3. A power input terminal e1 of the second comparator U2 is connected to the power supply VCC. A ground terminal f1 of the second comparator U2 is grounded. An output terminal g1 of the second comparator U2 is connected to a first terminal h1 of the seventh resistor R7 and the second power supply respectively. A second terminal i1 of the seventh resistor R7 is connected to the power supply VCC.

It should be understood that the second comparator U2 may be a general low-cost comparator, such as LM393, of course, it may also be of other types, which is not limited in this embodiment.

Figure 3:
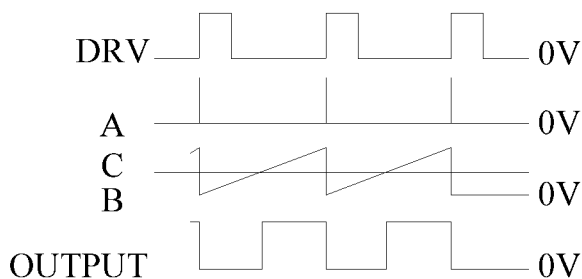
FIG. 3 is a diagram of voltage waveforms at points DRV, A, B, C, and OUTPUT in FIG. 2.

In the implementation, the seventh resistor R7 is a pull-up resistor, which cooperates with the second comparator U2 to output the required waveform. The second comparator U2 is configured to compare the divided voltage of the peak voltage with the voltage of the second capacitor C2, that is, the voltages at point C and point B. When VC>VB, the comparator U2 outputs a high level through the pull-up resistor R7. When VC<VB, the comparator U2 outputs a low level, and the voltage waveform diagrams at points DRV, A, B, C, and OUTPUT are shown in FIG. 3.

In this embodiment, the accuracy of voltage peak sampling is improved by setting the resistance of the pull-up resistor in the peak sampling unit. By adjusting the resistance of the resistor in the voltage regulation unit, a pulse signal with a fixed phase relationship with the power supply drive pulse may be generated, and the rising edge of the pulse signal may be configured to synchronize another power supply, thereby reducing the peak power of the power supplies, reducing interference generated by the power supplies, and improving the reliability of the power supplies themselves. This application is suitable for staggered-phase working of two power supplies.

This application further provides a power supply device. The power supply device includes the phase tracking pulse generation circuit as described above. For the circuit structure of the phase tracking pulse generation circuit of the power supply device, refer to the above-mentioned embodiments, which will not be repeated here. It is understood that since the power supply device of this embodiment adopts the technical solution of the above-mentioned phase tracking pulse generation circuit, the power supply device has all the above-mentioned beneficial effects.

The above are only optional embodiments of this application and do not limit the patent scope of this application. Any equivalent structure or equivalent process transformation made by the description and drawings of this application, or directly or indirectly used in other related technical fields are similarly included in the patent protection scope of this application.

What is claimed is:

1. A phase tracking pulse generation circuit, comprising a constant current circuit, a peak voltage circuit, a pulse rising edge extraction circuit, a switch circuit, a charge and discharge circuit, and a comparison circuit; wherein the pulse rising edge extraction circuit is configured to receive a drive pulse output by a first power supply, the comparison circuit is configured to output a phase tracking pulse to a second power supply, the constant current circuit is connected to the peak voltage circuit and the charge and discharge circuit respectively, the pulse rising edge extraction circuit is connected to the switch circuit, the switch circuit is connected to the charge and discharge circuit and the comparison circuit respectively, and the charge and discharge circuit is connected to the comparison circuit; wherein, the constant current circuit is configured to generate a constant current, and charge the charge and discharge circuit;

the pulse rising edge extraction circuit is configured to extract the drive pulse of the first power supply, and control on and off of the switch circuit according to the drive pulse;

the switch circuit is configured to control the charge and discharge circuit to discharge when the switch circuit is turned on;

the charge and discharge circuit is configured to provide a first voltage to the comparison circuit during charge or discharge;

the peak voltage circuit is configured to extract a peak voltage of the charge and discharge circuit, adjust the peak voltage to obtain a second voltage, and output the second voltage to the comparison circuit; and the comparison circuit is configured to compare the first voltage with the second voltage and output the phase tracking pulse, wherein the peak voltage circuit comprises a peak sampling unit and a voltage regulation unit; the peak sampling unit is connected to the constant current circuit, the charge and discharge circuit, and the voltage regulation unit respectively, and the voltage regulation unit is connected to the comparison circuit.

2. The phase tracking pulse generation circuit of claim 1, wherein the peak sampling unit comprises a first comparator, a first resistor, a first diode and a first capacitor; wherein, a first voltage input terminal of the first comparator is connected to the constant current circuit and the charge and discharge circuit respectively, a second voltage input terminal of the first comparator is connected to a first terminal of the first capacitor and the voltage regulation unit respectively, an output terminal of the first comparator is connected to a first terminal of the first resistor and an anode of the first diode respectively, a power input terminal of the first comparator is connected to a power supply, and a ground terminal of the first comparator is grounded;

a second terminal of the first resistor is connected to the power supply;

a cathode of the first diode is connected to the second voltage input terminal of the first comparator, the first terminal of the first capacitor and the voltage regulation unit respectively; and a second terminal of the first capacitor is grounded.

3. The phase tracking pulse generation circuit of claim 2, wherein the voltage regulation unit comprises a second resistor and a third resistor; a first terminal of the second resistor is connected to the cathode of the first diode and the first terminal of the first capacitor respectively, a second terminal of the second resistor is connected to the comparison circuit, and the second terminal of the second resistor is further grounded through the third resistor.

4. The phase tracking pulse generation circuit of claim 3, wherein the constant current circuit comprises a first triode, a fourth resistor, a fifth resistor, and a second diode; wherein, a base of the first triode is grounded through the fourth resistor, the base of the first triode is further connected to an anode of the second diode, and an emitter of the first triode is connected to a first terminal of the fifth resistor, and a collector of the first triode is connected to the first voltage input terminal of the first comparator and the charge and discharge circuit respectively;

a cathode of the second diode is connected to the power supply; and a second terminal of the fifth resistor is connected to the power supply.

5. The phase tracking pulse generation circuit of claim 4, wherein the second diode is a Zener diode.

6. The phase tracking pulse generation circuit of claim 4, wherein the charge and discharge circuit comprises a second capacitor; a first terminal of the second capacitor is connected to the comparison circuit, the collector of the first triode, the switch circuit and the first voltage input terminal of the first comparator respectively, and a second terminal of the second capacitor is grounded.

7. The phase tracking pulse generation circuit of claim 6, wherein the pulse rising edge extraction circuit comprises a third capacitor, a third diode, and a sixth resistor; a first terminal of the third capacitor is configured to receive the drive pulse output by the first power supply, a second terminal of the third capacitor is grounded through the third diode, the second terminal of the third capacitor is further grounded through the sixth resistor, and the second terminal of the third capacitor is further connected to the switch circuit.

8. The phase tracking pulse generation circuit of claim 7, wherein the switch circuit comprises a second triode; a gate of the second triode is connected to the second terminal of the third capacitor, a drain of the second triode is connected to the comparison circuit and the first terminal of the second capacitor respectively, and a source of the second triode is grounded.

9. The phase tracking pulse generation circuit of claim 8, wherein the comparison circuit comprises a second comparator and a seventh resistor; wherein, a first voltage input terminal of the second comparator is connected to the first terminal of the second capacitor, a second voltage input terminal of the second comparator is connected to a first terminal of the third resistor, a power input terminal of the second comparator is connected to the power supply, a ground terminal of the second comparator is grounded, and an output terminal of the second comparator is connected to a first terminal of the seventh resistor and the second power supply respectively; and a second terminal of the seventh resistor is connected to the power supply.

10. A power supply device, comprising a phase tracking pulse generation circuit, wherein the phase tracking pulse generation circuit comprises a constant current circuit, a peak voltage circuit, a pulse rising edge extraction circuit, a switch circuit, a charge and discharge circuit, and a comparison circuit; the pulse rising edge extraction circuit is configured to receive a drive pulse output by a first power supply, the comparison circuit is configured to output a phase tracking pulse to a second power supply, the constant current circuit is connected to the peak voltage circuit and the charge and discharge circuit respectively, the pulse rising edge extraction circuit is connected to the switch circuit, the switch circuit is connected to the charge and discharge circuit and the comparison circuit respectively, and the charge and discharge circuit is connected to the comparison circuit; wherein, the constant current circuit is configured to generate a constant current, and charge the charge and discharge circuit;

the pulse rising edge extraction circuit is configured to extract the drive pulse of the first power supply, and control on and off of the switch circuit according to the drive pulse;

the switch circuit is configured to control the charge and discharge circuit to discharge when the switch circuit is turned on;

the charge and discharge circuit is configured to provide a first voltage to the comparison circuit during charge or discharge;

the peak voltage circuit is configured to extract a peak voltage of the charge and discharge circuit, adjust the peak voltage to obtain a second voltage, and output the second voltage to the comparison circuit; and the comparison circuit is configured to compare the first voltage with the second voltage and output the phase tracking pulse, wherein the peak voltage circuit comprises a peak sampling unit and a voltage regulation unit; the peak sampling unit is connected to the constant current circuit, the charge and discharge circuit, and the voltage regulation unit respectively, and the voltage regulation unit is connected to the comparison circuit.

11. The power supply device of claim 10, wherein the peak sampling unit comprises a first comparator, a first resistor, a first diode and a first capacitor; wherein, a first voltage input terminal of the first comparator is connected to the constant current circuit and the charge and discharge circuit respectively, a second voltage input terminal of the first comparator is connected to a first terminal of the first capacitor and the voltage regulation unit respectively, an output terminal of the first comparator is connected to a first terminal of the first resistor and an anode of the first diode respectively, a power input terminal of the first comparator is connected to a power supply, and a ground terminal of the first comparator is grounded;

a second terminal of the first resistor is connected to the power supply;

a cathode of the first diode is connected to the second voltage input terminal of the first comparator, the first terminal of the first capacitor and the voltage regulation unit respectively; and a second terminal of the first capacitor is grounded.

12. The power supply device of claim 11, wherein the voltage regulation unit comprises a second resistor and a third resistor; a first terminal of the second resistor is connected to the cathode of the first diode and the first terminal of the first capacitor respectively, a second terminal of the second resistor is connected to the comparison circuit, and the second terminal of the second resistor is further grounded through the third resistor.

13. The power supply device of claim 12, wherein the constant current circuit comprises a first triode, a fourth resistor, a fifth resistor, and a second diode; wherein, a base of the first triode is grounded through the fourth resistor, the base of the first triode is further connected to an anode of the second diode, and an emitter of the first triode is connected to a first terminal of the fifth resistor, and a collector of the first triode is connected to the first voltage input terminal of the first comparator and the charge and discharge circuit respectively;

- a cathode of the second diode is connected to the power supply; and
- a second terminal of the fifth resistor is connected to the power supply.

14. The power supply device of claim 13, wherein the second diode is a Zener diode.

15. The power supply device of claim 13, wherein the charge and discharge circuit comprises a second capacitor; a first terminal of the second capacitor is connected to the comparison circuit, the collector of the first triode, the switch circuit and the first voltage input terminal of the first comparator respectively, and a second terminal of the second capacitor is grounded.

16. The power supply device of claim 15, wherein the pulse rising edge extraction circuit comprises a third capacitor, a third diode, and a sixth resistor; a first terminal of the third capacitor is configured to receive the drive pulse output by the first power supply, a second terminal of the third capacitor is grounded through the third diode, the second terminal of the third capacitor is further grounded through the sixth resistor, and the second terminal of the third capacitor is further connected to the switch circuit.

17. The power supply device of claim 16, wherein the switch circuit comprises a second triode; a gate of the second triode is connected to the second terminal of the third capacitor, a drain of the second triode is connected to the comparison circuit and the first terminal of the second capacitor respectively, and a source of the second triode is grounded.

18. The power supply device of claim 17, wherein the comparison circuit comprises a second comparator and a seventh resistor; wherein,

- a first voltage input terminal of the second comparator is connected to the first terminal of the second capacitor, a second voltage input terminal of the second comparator is connected to a first terminal of the third resistor, a power input terminal of the second comparator is connected to the power supply, a ground terminal of the second comparator is grounded, and an output terminal of the second comparator is connected to a first terminal of the seventh resistor and the second power supply respectively; and
- a second terminal of the seventh resistor is connected to the power supply.

\* \* \* \* \*